United States Patent [19]

Ghanayem et al.

[11] Patent Number: 5,328,722

[45] Date of Patent: * Jul. 12, 1994

[54] METAL CHEMICAL VAPOR DEPOSITION PROCESS USING A SHADOW RING

[75] Inventors: Steve Ghanayem, Sunnyvale; Virendra Rana, Los Gatos, both of Calif.

[73] Assignee: Applied Materials, Inc., Santa Clara, Calif.

[*] Notice: The portion of the term of this patent subsequent to Apr. 19, 2011 has been disclaimed.

[21] Appl. No.: 972,674

[22] Filed: Nov. 6, 1992

[51] Int. Cl.⁵ .......................................... C23C 15/04
[52] U.S. Cl. .................................. 427/250; 427/251; 427/252; 427/253; 427/255; 427/255.1; 427/255.5; 427/404; 427/405; 427/409; 427/419.7; 118/715; 118/720; 118/721; 118/728; 118/729
[58] Field of Search ............... 118/720, 721, 715, 728, 118/729; 427/250, 252, 248.1, 251, 255, 255.1, 253, 255.5, 404, 405, 409, 419.7

[56] References Cited

U.S. PATENT DOCUMENTS

| | | | |
|---|---|---|---|
| 4,842,683 | 6/1989 | Gheng et al. | 156/345 |
| 4,931,135 | 6/1990 | Horiuchi et al. | 156/643 |
| 4,932,358 | 6/1990 | Studley et al. | 118/728 |
| 4,951,601 | 8/1990 | Maydan et al. | 118/719 |
| 4,962,727 | 10/1990 | Harada | 118/723 |
| 4,963,393 | 10/1990 | Goela et al. | 427/248.1 |
| 4,963,713 | 10/1990 | Horiuchi et al. | 219/121.43 |
| 4,978,412 | 12/1990 | Aoki et al. | 156/345 |
| 4,978,558 | 12/1990 | Lamm | 427/252 |
| 4,990,374 | 2/1991 | Keeley et al. | 427/255.1 |
| 5,013,400 | 5/1991 | Kurasaki et al. | 156/643 |
| 5,173,336 | 12/1992 | Kennedy | 427/252 |

FOREIGN PATENT DOCUMENTS 2196019 10/1986 United Kingdom ......... C23C 16/44

Primary Examiner—Anthony Green
Attorney, Agent, or Firm—John P. Taylor

[57] ABSTRACT

An improved process is disclosed for depositing a layer of metal on a semiconductor wafer wherein a shadow ring normally engages the end edge of the front surface of the wafer to inhibit deposition of the metal on the backside of the wafer and a barrier or nucleation layer is deposited on the unshielded portion of the front surface of the wafer prior to the deposition of the metal layer thereon, and wherein gases used to form the metal layer may contact and react with underlying materials on the front surface of the wafer beneath the shadow ring. The improvement in the process comprises depositing the barrier layer over the entire front surface of the wafer while the wafer and the shadow ring are spaced apart; and then depositing the metal layer on the front surface of the wafer, while engaging the shadow ring with the wafer to inhibit deposition on the backside of the wafer; whereby the deposition of the barrier layer over the entire front surface of the wafer will shield underlying materials on the front surface of the wafer beneath the shadow ring from reaction with one or more of the gases used in the deposition of the metal layer.

25 Claims, 3 Drawing Sheets

```
┌─────────────────────────────────────┐
│ DEPOSITING A 300-700 ANGSTROM       │
│ BARRIER LAYER OF TUNGSTEN AT LOW    │
│ PRESSURE ON THE ENTIRE FRONT        │
│ SURFACE OF A SEMICONDUCTOR WAFER    │
│ WHILE SPACING A SHIELD RING FROM    │
│ THE WAFER                           │
└─────────────────────────────────────┘
                  │
┌─────────────────────────────────────┐
│ THEN ENGAGING THE OUTER EDGE OF     │
│ THE FRONT SURFACE OF THE WAFER      │
│ WITH A SHIELD RING TO PREVENT       │
│ DEPOSITION GASES FROM FLOWING       │
│ AROUND THE WAFER TO DEPOSIT ON      │
│ THE BACKSIDE OF THE WAFER           │
└─────────────────────────────────────┘
                  │
┌─────────────────────────────────────┐
│ THEN DEPOSITING A LAYER OF TUNGSTEN │
│ ON THE UNSHIELDED FRONT SURFACE     │
│ OF THE WAFER AT A HIGHER PRESSURE   │
└─────────────────────────────────────┘
```

FIG. 3

METAL CHEMICAL VAPOR DEPOSITION PROCESS USING A SHADOW RING

BACKGROUND OF THE INVENTION

1. Field of the Invention

This invention relates to an improved CVD process for depositing a metal layer on a semiconductor wafer. More particularly, this invention relates to an improved CVD process for depositing a metal layer on a semiconductor wafer wherein reaction is inhibited between the metal deposition gases and materials already on the wafer under a shadow ring used to inhibit deposition of the metal on the backside and end edge of the wafer.

2. Description of the Related Art

In the deposition of a metal layer, such as a tungsten layer, on the surface of a semiconductor wafer, a problem was previously encountered with undesired deposition of the metal on the backside and end edge of the wafer, due to the migration of the deposition gases, from above the wafer, around the end edge of the wafer to the backside of the wafer.

These deposition gases are usually admitted to the CVD chamber from a gas inlet or "showerhead" located adjacent the top of the CVD reactor, i.e., above the wafer which is conventionally mounted horizontally in the reactor with the upper or front surface, onto which the metal layer is to be deposited, facing toward the incoming deposition gases.

To solve this problem of undesired deposition on the backside of the wafer, it was previously proposed to use a shadow or shield ring which surrounds the wafer and has a central opening slightly smaller than the OD of the wafer so that the shadow ring may be lowered onto the wafer to engage the peripheral edge of the front surface of the wafer, leaving the front surface available for deposition while effectively blocking migration of the deposition gases around the end edge of the wafer to deposit on the backside of the wafer. An opening is further provided in the shadow ring adjacent the end edge of the shadow ring through which a purge gas is upwardly flowed from beneath the shadow ring. This flow of purge gas acts as a further inhibiter or shield to prevent the deposition gases from reaching the backside of the wafer.

While this method and apparatus does inhibit the unwanted deposition of metal materials on the backside of the wafer, its use has created certain other problems, in particular when certain metals are deposited on the semiconductor wafer.

For example, when a layer of tungsten is deposited on a semiconductor wafer, it is common to provide an underlying layer of titanium nitride as an adhesion or "glue" layer which facilitates the bonding of the tungsten metal to the underlying substrate. To further facilitate the deposition of a satisfactory tungsten layer thereon, it is also common to deposit a nucleation layer of tungsten at a low pressure, e.g., of less than 10 Torr, over the titanium nitride layer prior to the main deposit of tungsten, from $WF_6$ gas at a pressure of about 80 Torr. This nucleation layer is deposited using a reaction of $WF_6$ with $SiH_4$.

However, it has been found that when a shadow ring is used to shield the backside of the wafer from deposition of tungsten thereon, some of the $WF_6$ gas, from the higher pressure main deposition, may migrate under the shadow ring. This can cause problems because materials in some forms of titanium nitride, e.g., unreacted titanium, may react with the $WF_6$ gas, resulting in an undesirable peeling of one or both of the tungsten/titanium nitride layers.

This problem does not occur in the main (unshielded) portion of the front surface of the wafer because the low pressure nucleation layer of tungsten, applied prior to the main deposition, further acts as a barrier layer through which the $WF_6$ gas from the main deposition cannot penetrate to reach the underlying titanium nitride. This tungsten barrier layer is formed without reaction between the titanium nitride layer and the $WF_6$ gas used to form the tungsten nucleation layer because the deposition of the tungsten nucleation layer is carried out using a mixture of $WF_6$ and $SiH_4$ gases which react very quickly to form tungsten so that little, if any, unreacted $WF_6$ gas is available to penetrate into the underlying titanium nitride layer.

However, since the tungsten nucleation layer is deposited at a lower pressure than the main tungsten deposition, the gases forming the tungsten nucleation layer do not migrate under the shadow ring as easily as do the subsequent higher pressure tungsten deposition gases. The result is that the $WF_6$ gas flowing into the reaction chamber during the main tungsten deposition can migrate under the shadow ring and then penetrate into the underlying (and unprotected) titanium nitride layer on the front surface of the wafer beneath the shadow ring, resulting in the undesired peeling and particle formation.

It should be further noted that not all of the front surface of the wafer beneath the shadow ring at the periphery of the wafer is covered by titanium nitride. There are also small areas of exposed oxide representing regions where wafer clamps contacted the front surface of the wafer during the titanium nitride formation. Therefore, even if one could somehow protect the wafer from backside deposition in some other manner, i.e., eliminating the shadow ring, deposition of a thick (e.g., 1-2 micron) layer of tungsten over the oxide portions would also result in undesirable peeling of the tungsten layer at those points.

It would, therefore, be desirable to provide a process of forming a metal layer, such as a tungsten layer, over a semiconductor wafer in a manner which would protect the backside of the wafer from deposition, yet not result in an undesirable peeling of material deposited on the front side of the wafer beneath the shadow ring.

SUMMARY OF THE INVENTION

The invention comprises an improved process for depositing a layer of metal on a semiconductor wafer wherein a shadow ring normally engages the end edge of the front surface of the wafer to inhibit deposition of the metal on the backside of the wafer and a nucleation layer is deposited on the unshielded portion of the front surface of the wafer prior to the deposition of the metal layer thereon, and wherein gases used to form the metal layer may contact and react with underlying materials on the front surface of the wafer beneath the shadow ring, the improved process comprising: depositing the nucleation layer while the wafer and the shadow ring are spaced apart; then engaging the shadow ring with the wafer to inhibit deposition on the backside of the wafer; and then depositing the metal layer on the front surface of the wafer; whereby the deposition of the nucleation layer over the entire front surface of the wafer will provide a barrier layer to shield underlying materials on the front surface of the wafer beneath the shadow ring from reaction with one or more of the gases used in the deposition of the metal layer.

BRIEF DESCRIPTION OF THE DRAWINGS

FIG. 3 is a flowsheet illustrating the process of the invention.

DETAILED DESCRIPTION OF THE INVENTION

Figure 1:
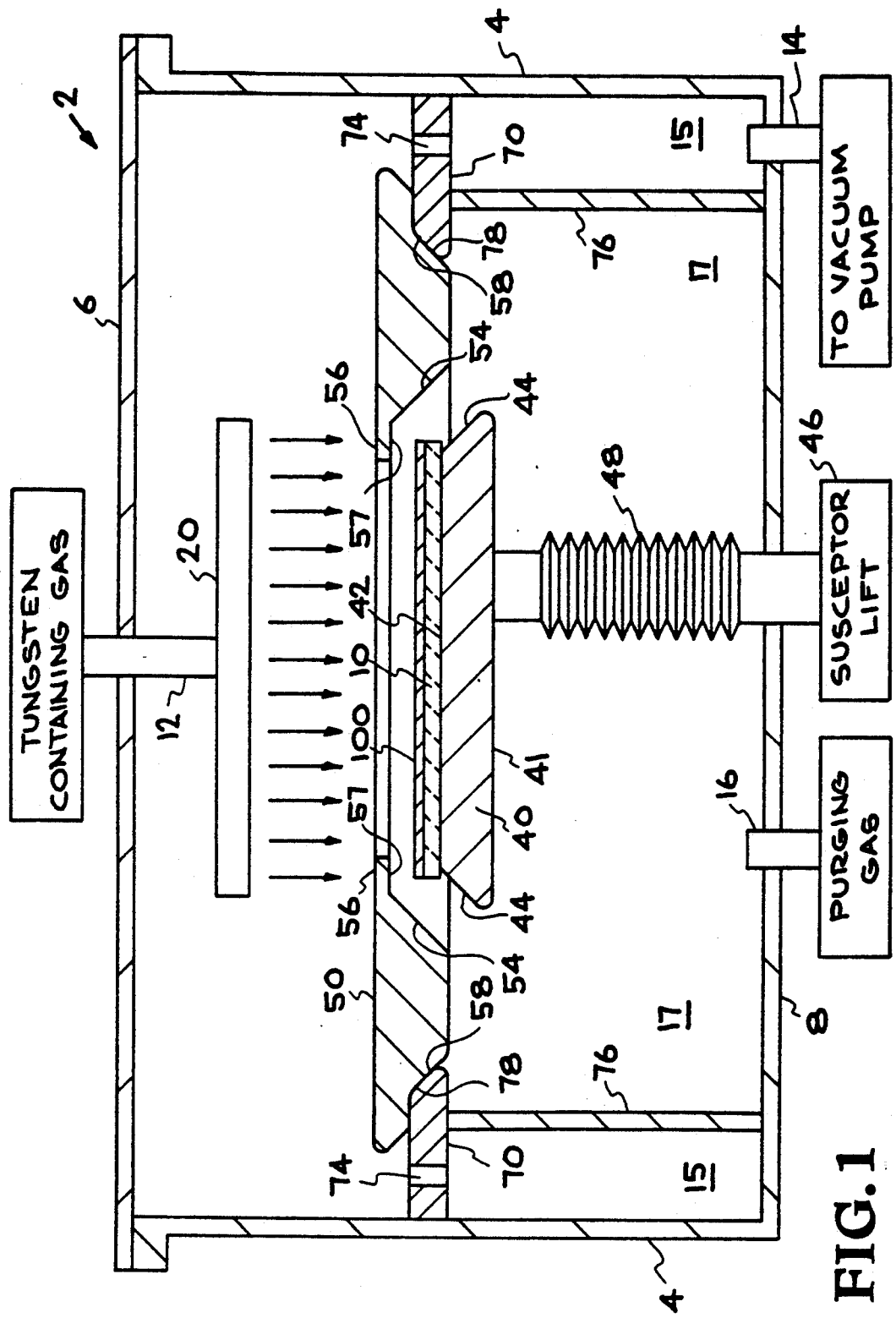
FIG. 1 is a vertical cross-sectional view of the position of the shadow ring and the wafer in the deposition apparatus during deposition of the nucleation layer of tungsten.
Figure 2:
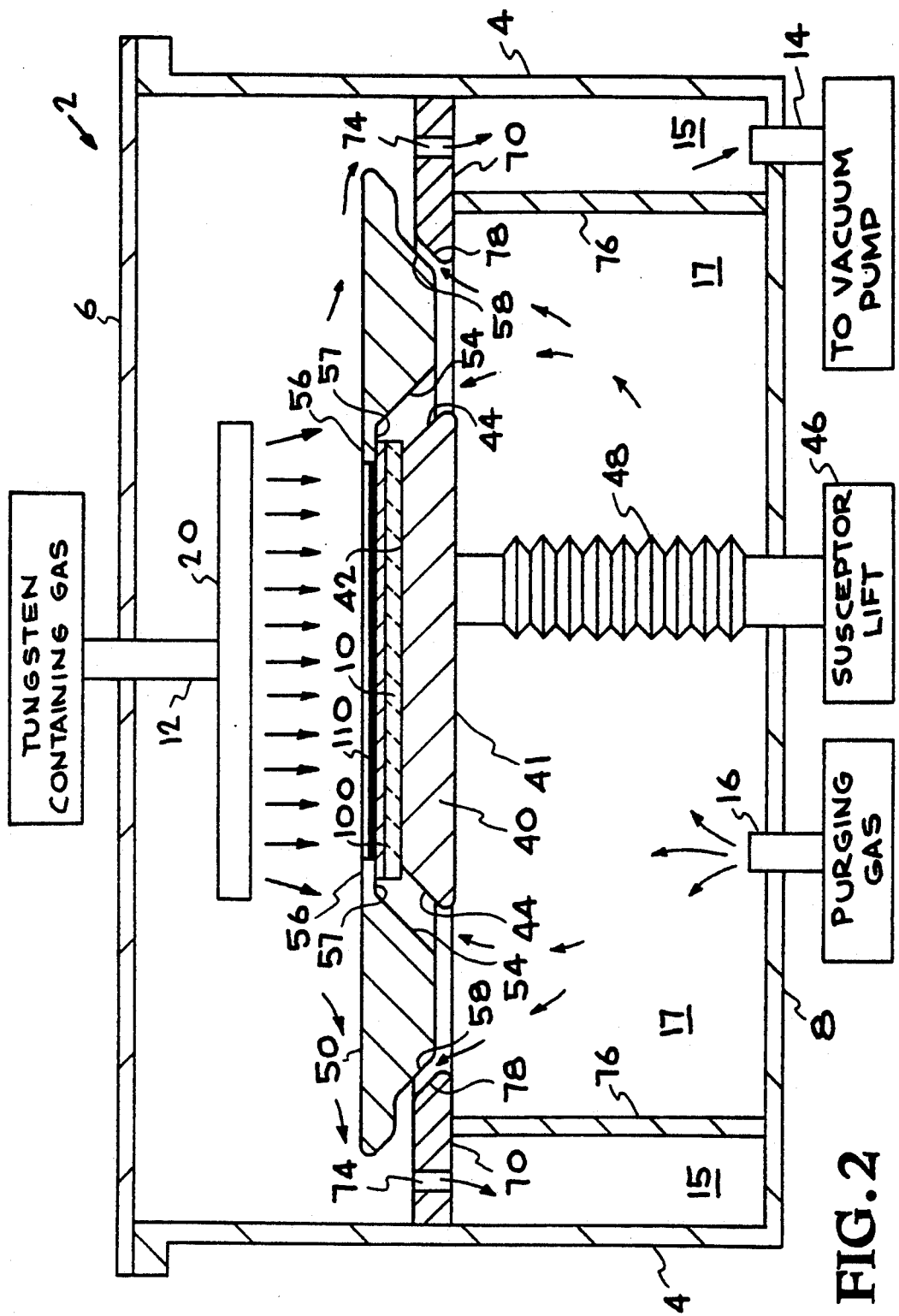
FIG. 2 is a vertical cross-sectional view of the position of the shadow ring and the wafer in the deposition apparatus during the subsequent deposition of the tungsten metal layer over the barrier layer.

The apparatus in which the process of the invention may be carried out is generally shown in FIGS. 1 and 2. In FIG. 1, the wafer and its supporting susceptor are shown in a lowered position out of contact with the shadow ring, which is the position used during the step of depositing the nucleation layer, while in FIG. 2, the wafer and supporting susceptor are shown in a raised position in contact with the shadow ring for the main deposition step.

The shadow ring apparatus used in the process of the invention is generally described and claimed in U.S. Pat. application Ser. No. 07/622,664, filed Dec. 5, 1990, and now abandoned; and U.S. Pat. application Ser. No. 07/823,942, filed Jan. 22, 1992, as a continuation-in-part application of Ser. No. 07/622,664. Both of these applications are assigned to the assignee of this invention and the description in those applications of the shadow ring deposition apparatus is hereby incorporated by reference into this application.

Referring now in particular to FIGS. 1 and 2, a CVD processing chamber is generally indicated at 2 which contains a wafer 10 mounted on a vertically movable susceptor 40 beneath a gas outlet or showerhead 20 through which gas used in the deposition of the metal layer enters chamber 2. A shadow ring 50, which normally rests on a support means 70 in chamber 2, engages the frontside edge of wafer 10 when susceptor 40 and wafer 10 are raised to a deposition position in chamber 2, as shown in FIG. 2. Shadow ring 50, by engaging the front side edge of wafer 10, shields the edge of the top surface of wafer 10, as well as the end edge and the backside of wafer 10, from the deposition as will be explained in more detail below.

Chamber 2 includes sidewalls 4, top wall 6, and bottom wall 8. Process gas entering inlet tube 12 in top wall 6 is discharged into vacuum chamber 2 through showerhead 20 which is positioned above wafer 10. Provision for the flow of a purging gas into chamber 2 is made through an inlet port or tube 16 through bottom wall 8. This purging gas is used in cooperation with shadow ring 50 to inhibit the flow of the deposition gas to the backside of the wafer.

A vacuum port 14, leading to a vacuum pump, may also be located, as shown, on bottom wall 8, or alternatively, on sidewall 4. The support means 70 for shadow ring 50 may be operationally connected to sidewalls 4 of chamber 2.

A sleeve or skirt member 76 may be provided to depend downwardly from support means 70 to bottom wall 8 to divide the bottom portion of chamber 2 into an outer portion 15 in communication with vacuum outlet 14, and an inner portion 17 into which the purge gas flows from inlet 16. Pumping holes or openings 74 in support means 70 permit both the deposition gas and purge gas to enter outer portion 15 from which they are pumped out of chamber 2 via vacuum outlet 14.

Susceptor 40, on which wafer 10 is supported in chamber 2, may comprise a disk-like circular metal member having a broad base or bottom surface 41 with a tapered sidewall 44 leading to a narrower top surface 42 which is designed to be approximately equal in diameter to the diameter of wafer 10 at the deposition temperature, e.g., at a temperature ranging from about 200° C. to about 700° C.

Susceptor 40 is movable vertically within chamber 2 via lift means which may comprise, by way of example and not of limitation, mechanical means such as stepper motor means or, as illustrated, fluid power means 46 and an expandable lift tube means 48 having bellows to permit vertical expansion of tube means 48 when hydraulic or pneumatic fluid is pumped into lift tube means 48 by fluid power means 46. FIG. 1 shows lift tube means 48 in a retracted position, resulting in susceptor 40 and wafer 10 thereon being in a lowered position for the first deposition step of the process to deposit the barrier layer on the wafer. FIG. 2, in contrast, shows lift tube means 48 in an expanded position to raise susceptor 40 and wafer 10 thereon into position below showerhead 20 for the second CVD processing step to deposit the desired metal layer onto the wafer.

When susceptor 40 and wafer 10 thereon are raised to the operating or deposition position, as shown in FIG. 2, the frontside edge (the edge of the top surface) of wafer 10 engages the undersurface of an inner lip 56 of shadow ring 50 and lifts shadow ring 50 off support means 70 on which shadow ring 50 normally rests when not engaged by wafer 10.

The central opening of shadow ring 50 may be provided with a tapered inner edge 54 on the lower surface of ring 50 having approximately the same angle of taper as tapered outer edge 44 on susceptor 40, i.e., a matching taper. Tapered inner edge 54 terminates, at its upper end, at inner lip 56. Inner lip 56, in turn, is dimensioned to inwardly extend circumferentially from tapered inner edge 54 a predetermined distance to extend over the frontside edge of wafer 10. Inner lip 56 has an undersurface 57 which is flat and parallel to the surface of wafer 10 to permit flat contact therebetween which will provide at least a partial seal to inhibit passage of the deposition gas or gases therebetween. The inner lip is usually dimensioned to extend inwardly over the front side edge of the wafer a distance of from about 1.5 to about 6 millimeters (mm.), typically about 5 mm., to provide the desired sealing and front side edge shielding.

The ID of the top portion of tapered inner edge 54 on shadow ring 50 is just slightly larger than the OD of top surface 42 of susceptor 40, i.e., by about a millimeter, while the ID of shadow ring 50 at the bottom of tapered inner edge 54 is larger than the OD of base 41 of susceptor 40 by approximately the same amount. This tolerance is provided for at least two reasons. First, the tolerance is provided to compensate for possible differences in thermal expansion when different materials are respectively used in constructing susceptor 40 and shadow ring 50. The tolerance is also provided to ensure that as susceptor 40 and wafer 10 thereon are lifted into contact with shadow ring 50, shadow ring 50 will not be supported by contact between tapered inner edge 54 of shadow ring 50 and tapered outer edge 44 of susceptor 40, but rather by contact of the underside of inner lip 56 with the top surface of wafer 10 to enhance the sealing therebetween.

Shadow ring 50 is provided with a tapered outer surface or edge 58 along at least the lower portion of the outer edge of ring 50 which matches a similarly tapered inner edge 78 provided on support means 70. When shadow ring 50 has been raised off support means 70 by susceptor 40, tapered edges 58 and 78 cooperate to provide a passageway for purging gas or gases, i.e., nonreactive gases such as argon, helium or the like, to pass through from below wafer 10 in chamber 2, as shown in FIG. 2. Such purging gases act to confine the deposition gases in chamber 2 to the volume above wafer 10 to inhibit undesired deposits onto the backside of the wafer.

The use of the above described apparatus in carrying out the process of the invention will now be described, by referring to the deposition of a tungsten layer, by way of illustration, and not of limitation.

As shown in FIG. 1, susceptor 40 and wafer 10 thereon are maintained in a lowered position out of contact with shadow ring 50 during the first step of the process which comprises the CVD formation of a barrier layer 100 over the underlying wafer surface, which barrier layer 100 may further serve as a nucleation layer for the subsequently deposited metal layer.

In the case of the deposition of a tungsten metal layer on the wafer, barrier layer 100 comprises a layer of tungsten which is first deposited over the underlying surface which usually comprises a titanium nitride layer applied over silicon, polysilicon, silicide, or oxide, to facilitate adherence of the tungsten metal to the wafer. The purpose of tungsten barrier layer 100 is both to protect any unreacted titanium in the underlying titanium nitride layer from reaction with the $WF_6$ used in the main metal deposition, as well as to provide a nucleation layer to facilitate the subsequent main tungsten deposition.

As shown in FIG. 1, barrier layer 100 is deposited over the entire upper or front surface of wafer 10, by virtue of the spacing of wafer 10 from shadow ring 50 during this deposition step. This deposition step is carried out, for example, on a 6" wafer, by flowing from about 5 to about 30 sccm of $SiH_4$ gas and from about 5 to about 10 sccm of $WF_6$ gas into the chamber while maintaining the chamber pressure at less than about 10 Torr, usually at about 3-6 Torr, and typically about 4.5 Torr, with the susceptor maintained at a temperature of from about 450° C. to about 500° C., preferably from about 465° C. to about 485° C., and typically about 475° C. The process is carried out until from about 300 to about 700 Angstroms, typically about 500 Angstroms, of tungsten have deposited on the underlying wafer surface.

To further ensure that the entire front surface of wafer 10 is provided with this thin barrier layer of tungsten, the flow of the purge gas into chamber 2 through inlet port 16 is preferably shut off. It should be noted, in this regard, that the deposition time needed to form a barrier layer of this thickness is very short, and the $SiH_4$ and $WF_6$ gases react together very quickly as they contact the front surface of the heated wafer so that little, if any, tungsten will deposit on the backside of the wafer during this barrier layer deposition step.

After deposition of barrier layer 100 on the front surface of wafer 10, susceptor lift 46 is activated to raise susceptor 40 and wafer 10 thereon into contact with lip 56 of shadow ring 50, thereby lifting shadow ring 50 off support member 70. At the same time, the flow of purging gas through inlet 16 may be activated. With the outer edge of wafer 10 in contact with shadow 50 to inhibit the flow of the deposition gases around the wafer to its backside, the flow of the deposition gases is commenced by flowing $H_2$ gas and $WF_6$ gas into the chamber at respective rates, for example for a 6" wafer, of about 500 sccm $H_2$ and about 75 sccm $WF_6$ into the chamber while maintaining a pressure in the chamber ranging from about 70 Torr to about 100 Torr, typically about 80 Torr, and maintaining the susceptor within the previous deposition temperature range, i e , from about 450° C. to about 500° C. preferably from about 465° C. to about 485° C., and typically about 475° C.

The main tungsten deposition step is then carried out for a sufficient period of time to obtain the desired thickness of deposited tungsten layer 110 shown in FIG. 2. Typically from about 0.5 to about 1.0 microns of tungsten metal are deposited during this main deposition step over a period of from 1 to about 2 minutes.

As a result of the previous deposition step to form barrier layer 100 over the entire front surface of wafer 10, any deposition gases, during this main deposition step, which may penetrate the space between wafer 10 and the undersurface of portions of shadow ring 50, e.g., under lip 56, at the high pressure used during the main deposition step, will not, however be able to attack underlying materials, such as unreacted titanium in an underlying titanium nitride layer. That is, due to the presence of previously deposited barrier layer 100 on the front surface of wafer 10 under shadow ring 50, portions of the underlying materials on the wafer front surface under shadow ring 50 will not be subject to attack by the deposition gases, e.g., $WF_6$.

Thus, the process of the invention provides for the formation of a barrier layer over the entire front surface of a wafer, whereby subsequent deposition of a metal layer on the front surface, using a shadow ring to inhibit deposition on the backside of the wafer, will not result in attack of portions of the wafer surface under the shadow ring by the process gases used in the subsequent deposition of the metal layer.

Having thus described the invention what is claimed is:

1. An improved process for depositing a layer of material on a substrate in a deposition chamber using a shadow ring to engage an outer edge of a front surface of the substrate to inhibit deposition of said layer of material on a backside of said substrate comprising:
   a) depositing a barrier layer on all of said front surface of said substrate while said shadow ring and said substrate are spaced apart;
   b) then engaging the shadow ring with said outer edge of said front surface of said substrate to inhibit flow of deposition gases toward said backside of said substrate; and
   c) then depositing said layer of material on said front surface of the substrate not engaged by said shadow ring;

whereby said deposition of said barrier layer over all of said front surface of said substrate will shield materials beneath said barrier layer on said front surface of said beneath the shadow ring from reaction with one or more of said deposition gases used in said deposition of said layer of material.

2. The process of claim 1 wherein said layer of deposited material consists essentially of a metal.

3. The process of claim 2 wherein said step of depositing said metal layer on said unshielded portions of said front surface of said substrate further comprises depositing a layer of tungsten metal on said substrate.

4. The process of claim 3 wherein said step of depositing sad layer of tungsten metal on said front surface of said substrate further comprises flowing a mixture of $H_2$ and $WF_6$ gases into said deposition chamber, while maintaining said chamber at a pressure of from about 70 Torr to about 100 Torr.

5. The process of claim 4 wherein said step of depositing said barrier layer protects materials on said substrate beneath said barrier layer from reacting with said $WF_6$ gas during said step of depositing said tungsten metal layer.

6. The process of claim 5 wherein said step of depositing said barrier layer further comprises depositing said barrier layer by flowing a mixture of $SiH_4$ and $WF_6$ gases into said deposition chamber until from about 300 to about 700 Angstroms of tungsten are deposited over said entire front surface of said substrate while maintaining each chamber at a pressure of less than about 10 Torr, whereby said $SiH_4$ and said $WF_6$ will react to form said barrier layer before said $WF_6$ reacts with said underlying materials.

7. The process of claim 5 wherein said underlying materials on said substrate comprise portions of an underlying titanium nitride layer on said substrate.

8. The process of claim 1 wherein said underlying materials on said substrate comprise unreacted titanium portions of an underlying titanium nitride layer on said substrate.

9. The process of claim 1 wherein said step of depositing said layer of material on said unshielded portions of said front surface of said substrate further comprises flowing a purge gas into said deposition chamber beneath said substrate to further inhibit flow of said deposition gases around the outer edge of said substrate to reach said backside of said substrate.

10. The process of claim 9 wherein said flowing of said purge gas is shut off during said step of depositing said barrier layer on said entire front surface of said substrate.

11. An improved process for depositing a layer of tungsten metal on a semiconductor wafer in a deposition chamber using a shadow ring to engage an end edge of a front surface of the wafer to inhibit deposition of said tungsten metal on a backside of said wafer wherein one or more deposition gases used to form said tungsten metal layer may contact and react with underlying materials on the front surface of said wafer beneath said shadow ring, which comprises:

a) depositing a tungsten barrier layer on said front surface of said wafer while said shadow ring and said wafer are spaced apart;

b) then engaging the shadow ring with said end edge of said front surface of said wafer to inhibit flow of tungsten deposition gases toward said backside of said wafer; and c) then depositing said tungsten metal layer over exposed portions of said tungsten barrier layer on said front surface of the wafer;

whereby said deposition of said tungsten barrier layer over all of said front surface of said wafer will shield underlying materials on said front surface of said wafer beneath the shadow ring from reaction with one or more of said tungsten deposition gases used in the deposition of said tungsten metal layer on said front surface of said wafer.

12. The process of claim 11 wherein said underlying materials include titanium nitride.

13. The process of claim 11 wherein said tungsten barrier layer is formed over said entire front surface of said wafer by flowing a mixture of $SiH_4$ and $WF_6$ gases into said deposition chamber until from about 300 to about 700 Angstroms of tungsten have been deposited on said front surface of said wafer, while maintaining said chamber at a pressure of less than about 10 Torr, whereby said $SiH_4$ and said $WF_6$ gases will react to form said metallic tungsten barrier layer before said $WF_6$ reacts with said underlying materials.

14. The process of claim 13 wherein said underlying materials include titanium nitride containing unreacted titanium capable of reacting with said $WF_6$.

15. The process of claim 13 wherein said tungsten metal layer is deposited over said tungsten barrier layer, after said shadow ring and said outer edge of said front surface of said wafer have made contact, by flowing a mixture of $H_2$ and $WF_6$ gases into said deposition chamber, while maintaining said deposition chamber at a pressure of from about 70 to about 100 Torr.

16. The process of claim 11 wherein said step of depositing said metal layer on said front surface of said wafer not engaged by said shadow ring further comprises flowing a purge gas into said deposition chamber beneath said wafer to further inhibit flow of said deposition gases around the outer edge of said wafer to reach said backside of said wafer.

17. The process of claim 16 wherein said purge gas flow is shut off during said step of depositing said barrier layer on said entire front surface of said wafer.

18. An improved process for depositing a layer of tungsten metal on a semiconductor wafer in a deposition chamber using a shadow ring to engage an end edge of a front surface of the wafer to inhibit deposition of said tungsten metal on a backside of said wafer wherein one or more deposition gases used to form said tungsten metal layer may contact and react with unreacted titanium in an underlying titanium nitride layer on said front surface of said wafer beneath said shadow ring, which comprises:

a) depositing a tungsten barrier layer on said front surface of said wafer while said shadow ring and said wafer are spaced apart by flowing a mixture of $SiH_4$ and $WF_6$ gases into said deposition chamber until from about 300 to about 700 Angstroms of tungsten have been deposited on said front surface of said wafer, while maintaining said chamber at a pressure of less than about 10 Torr, whereby said $SiH_4$ and said $WF_6$ gases will react to form said tungsten barrier layer before said $WF_6$ reacts with said unreacted titanium in said underlying titanium nitride layer;

b) then engaging the shadow ring with the end edge of said front surface of said wafer to inhibit flow of tungsten deposition gases toward said backside of said wafer; and c) then depositing said tungsten metal layer over exposed portions of said nucleation layer on said front surface of the wafer by flowing a mixture of $H_2$ and $WF_6$ gases into said deposition chamber, while maintaining said deposition chamber at a pressure of from about 70 to about 100 Torr;

whereby said deposition of said tungsten barrier layer over all of said front surface of said wafer will shield said unreacted titanium portions of said underlying titanium nitride layer on said front surface of said wafer beneath the shadow ring from reaction with said $WF_6$ deposition gas used in said deposition of said tungsten metal layer on said front surface of said wafer.

19. The process of claim 18 wherein said step of depositing said metal layer on said unshielded portions of said front surface of said wafer further comprises flowing a purge gas into said deposition chamber beneath said wafer to further inhibit flow of said deposition gases around the outer edge of said wafer to reach said backside of said wafer.

20. The process of claim 19 wherein said purge gas flow is shut off during said step of depositing said barrier layer on said entire front surface of said wafer.

21. An apparatus for deposition of a bilayer, comprising:
 a) a substrate holder for holding a substrate;
 b) a shadow ring vertically detachably supported on a member;
 c) lift means for moving said substrate holder relative to said member;
  i) whereby in a first position of said lift means said shadow ring is supported by said member, and
  ii) whereby in a second position of said lift means said shadow ring covers an outer peripheral portion of an upper surface of said substrate; and
 d) deposition means that in said first position of said lift means deposits a barrier layer upon all of said upper surface and that in said second position of said lift means deposits a overlying layer of material upon a central portion of said upper surface not covered by said shadow ring.

22. An apparatus as recited in claim 21, wherein said lift means vertically moves said substrate holder while said member remains stationary.

23. An apparatus as recited in claim 22, wherein said shadow ring is disposed on a vertically upper side of said substrate holder and said deposition means deposits onto said substrate from said vertically upper side.

24. An apparatus as recited in claim 23, further comprising a source of a purge gas disposed on a vertically lower side of said shadow ring.

25. An apparatus as recited in claim 24, wherein outer lateral sides of said substrate holder and inner lateral sides of a lower portion of said shadow ring are similarly tapered with a gap therebetween allowing passage of said purge gas.

* * * * *